United States Patent [19]

Mitchell

[11] 4,059,849
[45] Nov. 22, 1977

[54] INTERCONNECTED MODULE

[75] Inventor: James T. Mitchell, Lima, Ohio

[73] Assignee: Westinghouse Electric Corporation, Pittsburgh, Pa.

[21] Appl. No.: 533,405

[22] Filed: Dec. 16, 1974

[51] Int. Cl.² .......................................... H05K 5/00
[52] U.S. Cl. .................................. 361/395; 361/412
[58] Field of Search ................ 317/101 CC, 101 DH, 317/101 D; 339/17 N, 17 M, 17 LM; 29/624, 625, 626

[56] References Cited

U.S. PATENT DOCUMENTS

| | | | |
|---|---|---|---|
| 2,907,926 | 10/1959 | Slack | 317/101 D |
| 2,978,612 | 4/1961 | Lutton | 317/101 D |
| 3,087,096 | 4/1963 | Jorgensen | 317/101 D |
| 3,614,541 | 10/1971 | Farrand | 317/101 D |

FOREIGN PATENT DOCUMENTS 680,949  2/1964  Canada ............................ 317/101 D Primary Examiner—David Smith, Jr.
Attorney, Agent, or Firm—G. H. Telfer

[57] ABSTRACT

Solderable conductive strips bonded to ceramic insulator spacers interconnect terminals of adjacent substrates in a microcircuit module. Input-output connector pins are bonded to a selected base substrate and are electrically connected to the conductive strips which serve as through connecting means. Assembly and disassembly are accomplished by a reflow soldering procedure wherein hot gas is applied to the spacer-substrate interface, thereby minimizing the risk of substrate heat damage. The resulting electrical and mechanical connection is more reliable than the connection established by conventional structures having interconnecting pins since pin alignment stresses are eliminated.

9 Claims, 8 Drawing Figures

INTERCONNECTED MODULE

BACKGROUND OF THE INVENTION

1. Field of the Invention

This invention relates to electronic packaging and particularly to interlayer connecting means for multisubstrate modules.

2. Description of the Prior Art

The packaging of electron equipment has become a major factor in the design and manufacture of contemporary electronic systems. New packaging techniques are required to meet the demand for reduced physical size and improved reliability at lower cost. The problem of efficient packaging is particularly important in electronic circuits which utilize microcircuit structures.

Complex electronic circuits packaged with microcircuit techniques frequently utilize two or more substrates. In conventional structures such as that illustrated in FIG. 3 of the drawing, adjacent substrates are usually interconnected by connector pins which penetrate each substrate. Assembly and repair of modules which use pins as the interlayer connecting means is particularly difficult because each pin must be handled and soldered individually. To seperate the substrates and pins so that circuits located upon the substrates can be repaired, all pins must be heated simultaneously in a lengthy procedure which may result in heat damage to the substrate and associated circuitry. Furthermore, because some pins must be bent to provide proper alignment with substrate solder joints, harmful stress forces are sometimes imposed on the substrates. Because of the difficulties associated with pin connected modules, test and repair costs may exceed the cost of a new module, thus making the module non-repairable in an economic sense. It is, therefore, a principal object of the present invention to provide through connecting means which may be easily and quickly assembled or disassembled to adjacent substrates without risk of heat damage or substrate rupture.

SUMMARY OF THE INVENTION

The present invention provides an improved through connecting structure for multisubstrate electronic modules. The use of through connecting pins is eliminated by plurality of solderably conductive strips. The conductive strips are heat-bonded to ceramic insulator spacers which separate with support adjacent substrates. The conductive strips electrically connect circuit terminal members disposed upon the substrates with input and output pins which are bonded to a selected base substrate. The input and output pins are preferably bonded to the ceramic insulated spacers for increased mechanical strength. Adjacent substrates are assembled to the conductive strips by soldering the terminals to the end portions of the conductive strips. The substrates are not bonded directly to the ceramic spacers so that they may be easily removed for repair. Assembly or disassembly of the substrates may be accomplished by reflow soldering procedure wherein hot gas is directed upon the spacer-substrate solder interface. The risk of heat damage is minimized since the heat need only be applied for a short period to connect or remove the substrates. The resulting electrical and mechanical connections are more reliable than those provided by conventional structures since there is no mechanical stress imposed upon the connected substrates or associated circuitry as is frequently the case with pin connecting means which must be bent to provide proper alignment with substrate solder joints.

BRIEF DESCRIPTION OF THE DRAWINGS

The invention will be fully understood from the following detailed description of a preferred embodiment, taken in connection with the accompanying drawings, in which.

DESCRIPTION OF THE PREFERRED EMBODIMENT

The present invention is concerned primarily with interlayer connecting means for modular electronic structures. Accordingly, in the description which follows the invention is shown embodied in a two layer passive substrate microcircuit module. It should be understood, however, that the invention may be utilized as interlayer connecting means in any modular structure having two or more substrates. Furthermore, the invention may be used to interconnect active or passive substrates having a variety of circuit elements, including but not limited to discrete, microdiscrete, and integrated circuit components, and hybrid combinations of discrete and integrated devices.

Figure 1:
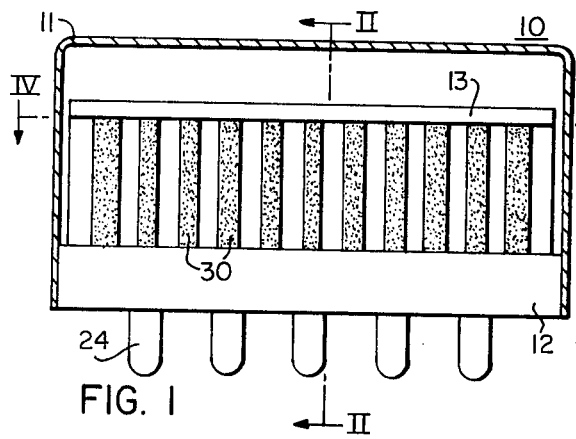
FIG. 1 is an elevation view of a module in which the invention is incorporated.

Referring now to the drawing, in FIG. 1 the invention is shown incorporated in a two layer passive substrate module 10. The module 10 may have two or any larger number of substrate layers, active or passive, but for the purposes of the present invention description it will be considered to be a two layer passive, planar substrate module having hybrid combinations of discrete and integrated circuit elements. The substrates may take any form glass or ceramic composition of usual substrate construction and are preferably adapted for conventional reflow soldering procedures. The module 10 is shown enclosed in a housing 11 and is generally rectangular in profile. The module 10 includes a base substrate 12 and a parallel disposed substrate 13. Circuit matrices 14 and 15 are disposed upon the substrates 12 and 13 respectively, and each circuit matrix includes a plurality of connecting terminals 16 and 17, the terminals 16 being designated as input terminals and the terminals 17 being designated as output terminals for each circuit matrix. The terminals 16, 17 and the circuit matrices 14, 15 may be printed or otherwise deposited in convention thick film or thin film structures produced by vacuum depositions, screen-fired depositions, or chemical depositions. The circuit matrices 14, 15 are indicated generally but details are not shown since the type of circuits to be interconnected are not relevent to the invention. The matrices 14, 15 may include various combinations of mocrodiscrete and integrated circuit components (not shown).

Figure 2:
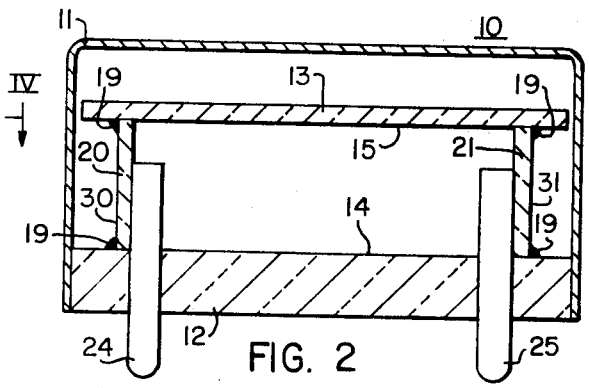
FIG. 2 is a sectional view of the module of FIG. 1 taken along the line II—II.

As shown in FIGS. 1 and 2, the substrates 12 and 13 are separated by two insulated spacing elements, 20 and 21. The insulated spacing elements 20 and 21 are rectangular in cross section and extend at right angles to the substrates 12 and 13, thus separating the substrates in a spaced, parallel relationship. The insulated spacing elements 20, 21 are preferably composed of ceramic material such as alumina although other material having good insulating properties and low coefficient of thermal expansion may be used to good advantage.

Figure 4:
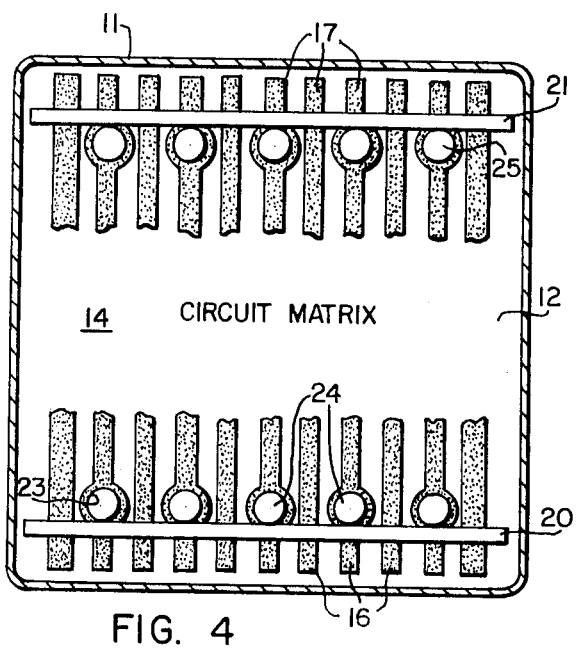
FIG. 4 is a top view of the base substrate of the module of FIG. 1 taken along line IV—IV.
Figure 5:
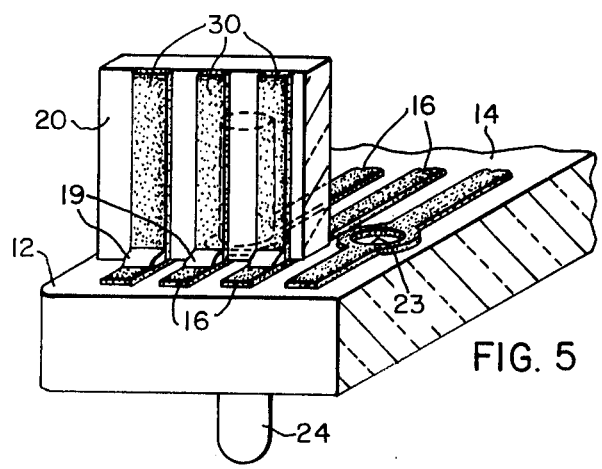
FIG. 5 is an enlarged isometric view of a portion of the module illustrated in FIG. 1.

The base structure 12 is provided with a plurality of eyelets 23, as shown in FIGS. 4 and 5, which extend through selected ones of terminals 16, 17 and which also extend completely through the body of the base substrate 12. Disposed within the eyelets 23 are a plurality of input-output pins 24 and 25, the pins 24 being designated as input pins and the pins 25 being designated as output pins for interconnection with a higher assembly (not shown). The upper portions of the pins 24, 25 are soldered or otherwise electrically connected to each eyelet 23 and are preferably chemically bonded by means of a nonconductive low temperature epoxy to the sides of the insulated spacing elements 20, 21 to provide a strong mechanical connection therewith.

Figure 3:
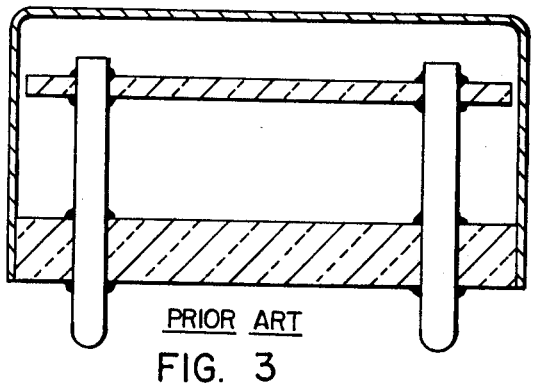
FIG. 3 is a sectional view of a prior art pin connected module.
Figure 6:
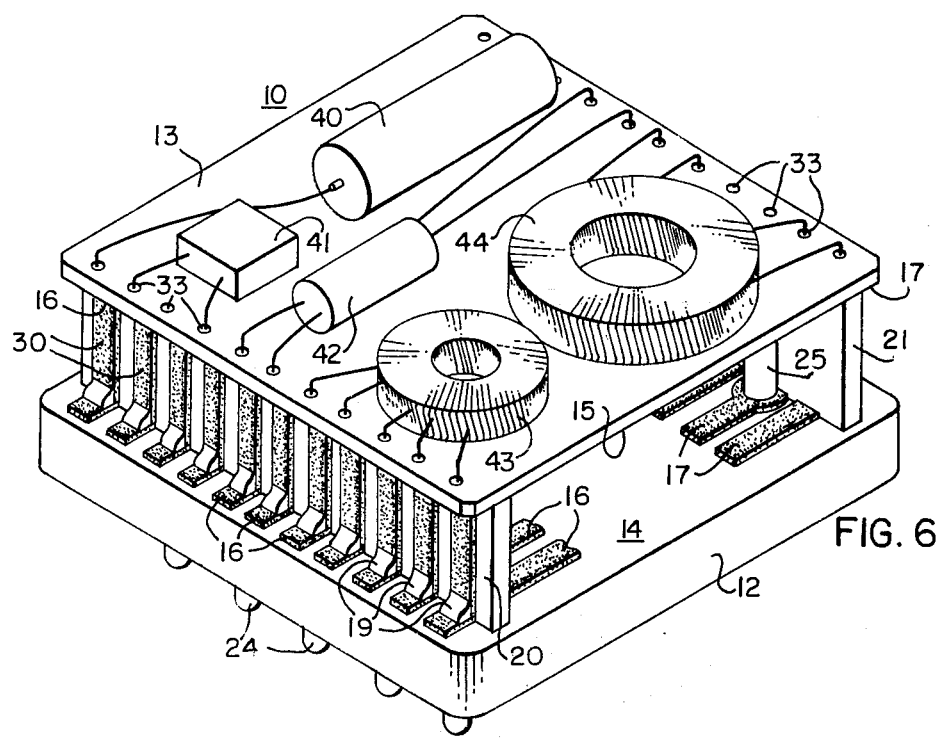
FIG. 6 is an isometric view of the module of FIG. 1 which illustrates an arrangement of discrete circuit components.

It should be noted that in the preferred embodiment the pins 24, 25 do not extend to the upper substrate 13 as in the conventional structure as illustrated in FIG. 3, but extend only to the mid-region of the insulated spacing elements 20, 21. The pins 24, 25 do not extend to the upper substrate 13 since contact with the substrate by the pins is not desired in the present invention. Instead, interconnection between the adjacent substrates 12 and 13 is provided by a plurality of conductive metallization strips 30, 31 which are heat-bonded to the outer surface of the insulated spacing elements 20, 21 as illustrated in FIGS. 1, 5 and 6. The strips 30, 31 are preferably screen printed in a thick film procedure and may comprise a noble metal deposition of approximately 1 mil in average thickness. Various noble metal pastes such as platinum gold or paladium silver may be used; however, the compound selected should be coordinated with the type to solder to be used. For example, a low temperature eutectic solder paste such as a 62-36-2 composition of tin, lead, and silver is preferably used for soldering the metallization strips 30, 31. Therefore a noble metal composition such as platinum gold, which is compatible with that type of solder, is used to form the metalization strips 30.

As illustrated in FIGS. 1, 2, and 5 the strips 30, 31 extend across the outer surfaces of the insulated spacing elements 20, 21 in a vertical arrangement and are horizontally spaced to corresponding in alignment with the input and output terminals 16, 17 of the circuit matrices 14, 15. Any convenient strip pattern may be used which will provide electrical contact between corresponding terminals of adjacent substrates.

Referring now to FIG. 2, substrates 12 and 13 are shown disposed in an inverted relation with respect to each other. That is, the circuit matrix 14 is disposed on top of the substrate 12 while the circuit matrix 15 is disposed on underside of the substrate 13. With the circuit matrices disposed within the interior of the module 10 there is less risk of handling damage to circuit wiring or components since none are exposed.

Assembly of the module 10 is accomplished by arranging the two substrates 12, 13 in an inverted parallel relationship with the two insulator elements 20, 21 disposed between and at opposite ends of the substrates.

The insulator elements should be placed so that the conductive strips 30, 31 are on the outside of the module with respect to the upper portions of the connector pins 24, 25 which lie adjacent to the insulated interior portions of the insulator elements 20, 21. The conductive strips 30, 31 are aligned and placed in contact with the terminals 16, 17. At this point the connector pins 24, 25 are preferably bonded to the adjacent insulated spacing elements 20, 21 with a non-conductive low temperature epoxy for increased mechanical strength.

A measured amount of solder paste is applied, preferably with a hypodermic needle, to the conductive strip-circuit terminal interface and heat is applied thereto until the solder coalesces with the metallization of the conductive strips and circuit terminals. Heating to the preferred soldering temperature is best accomplished by passing a hot gas such as hydrogen or nitrogen over the interface. Any gas having a high heat capacity and which can provide a reducing atmosphere to prevent oxidation may be used. A hot gas is the preferred heat source since it avoids pressure on the substrate interface and may be used to heat joints which are not easily accessible to other heating means such as soldering irons.

Figure 7:
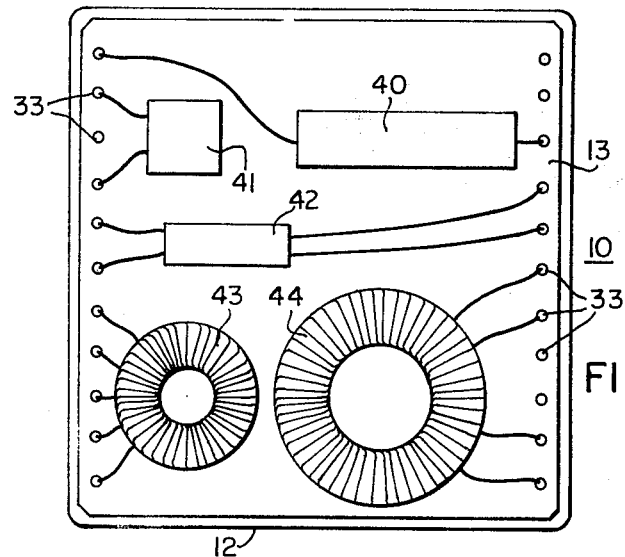
FIG. 7 is a top view of the module of FIG. 6.
Figure 8:
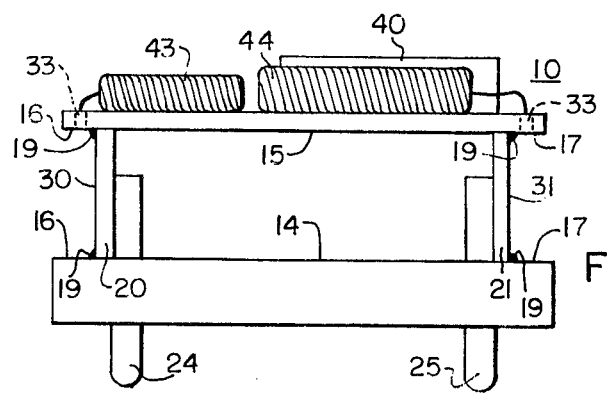
FIG. 8 is a side view of the module of FIG. 6.

An isometric view of the completely assembled module 10 is shown in FIG. 6. Also shown in FIG. 6 are discrete components 40, 41, 42, 43 and 44 which are disposed in operating position on the upper surface of the substrate 13. The discrete components are intraconnected with microdiscrete and integrated components, which are disposed on the underside of the substrate 13 (not shown), by means of solder eyelets 33 which extend completely through the substrate 13 to the input and output terminals 16, 17 located on the underside of the substrate 13. The eyelets 33 are located just outside of the spacer-substrate interface so that the connecting leads of the discrete components can be inserted through and connected with the terminals 16, 17 and strips 30, 31 in a conventional reflow soldering procedure. The arrangement of the discrete components is illustrated further in FIGS. 7 and 8.

The module 10 may be disassembled for repair quickly and easily by inverting the module and applying a hot gas along the insulated spacing element-substrate interface. The top substrate 13 will drop free as the solder melts. The circuit matrix of each substrate is then exposed for test or repair.

It will now be apparent that an improved through connecting means has been provided which establishes a highly conductive and mechanically tight connection for adjacent substrates of an electronic module. The module is easily assembled or disassembled without risk of heat damage or substrate rupture; therefore, the resulting electrical and mechanical connection is more reliable than that provided by conventional pin connected structures.

Certain preferred materials have been described for the purpose of illustration but it will be understood that other suitable materials could be used if desired. While the invention has been illustrated by a preferred embodiment, it should be understood that in the broadest aspects of the invention certain changes may be made by the omission of unwanted parts, by the addition of parts, or by the substitution of equivalents without departing from the scope of the invention.

What is claimed is:

1. A module comprising:
   a plurality of substrates;

a conductive circuit matrix having input and output terminals disposed on each of said substrates;

at least one insulated spacing element disposed between and holding said substrates in a spaced relationship;

a plurality of conductive strips disposed upon at least one of said insulated spacing elements, said conductive strips being electrically connected to said input and output terminals of adjacent substrates; and, a plurality of electrical connector pins disposed in electrical contact with said input and output terminals of a selected one of said substrates, said pins being mechanically connected to said selected substrate and to said at least one of said insulated spacing elements.

2. A module as defined in claim 1 wherein two of said substrates are disposed in a spaced, parallel relationship with two insulated spacing elements disposed between and at opposite ends of said substrates.

3. A module as defined in claim 1 wherein said conductive strips are metallization deposits which are adapted for electrical solder connection with said input and output terminals.

4. A module as defined in claim 1 wherein said substrates and said insulator elements are mechanically connected together by a solder bond between corresponding ones of said input and output terminals of adjacent substrates and said conductive strips of each insulated spacing element.

5. A module as defined in claim 1 wherein corresponding input and output terminals of adjacent substrates are disposed in alignment with one another and said conductive strips are disposed in a spaced relationship which corresponds in alignment with said input and output terminals of adjacent substrates.

6. A module as defined in claim 1 wherein each substrate and its associated circuit matrix are inverted with respect to each adjacent substrate and its associated circuit matrix.

7. A module as defined in claim 1 including:

a plurality of discrete circuit components having connecting leads, said discrete components being disposed upon a selected one of said substrates; and, a plurality of solder eyelets disposed upon selected ones of said substrates, said eyelets being electrically connected to said input and output terminals of each of said selected substrates, and said eyelets being electrically connected to said connecting leads of said discrete components.

8. A module as defined in claim 7 including, in combination, a plurality of microdiscrete and integrated circuit components, said microdiscrete and integrated circuit components being embedded within and electrically connected to the circuit matrix associated with each of said selected substrates, said discrete components being electrically connected with said microdiscrete and integrated circuit components through said input and output terminals and said circuit matrix.

9. A method of interconnecting substrates in a module having a plurality of substrates, a conductive circuit matrix with input and output terminals disposed upon each of said substrates, one or more insulated spacing elements disposed between and holding said substrates in a spaced relationship, and a plurality of electrical connector pins disposed in electrical contact with said input and output terminals of one of said substrates, said method comprising:

depositing a plurality of conductive strips on at least one of said insulated spacing elements in a pattern corresponding with the arrangement of said input and output terminals;

assembling said substrates to said insulated spacing elements so that corresponding terminals of adjacent substrates are disposed in electrical contact with said conductive strips;

depositing a predetermined amount of solder upon the interface of said terminals and strips;

applying heat to said interface and solder combination until said solder coalesces with said conductive strips and said terminals; and, bonding said electrical connector pins to said insulated spacing element.

* * * * *